(12) United States Patent
Gutierrez et al.

(10) Patent No.: US 6,905,613 B2
(45) Date of Patent: Jun. 14, 2005

(54) USE OF AN ORGANIC DIELECTRIC AS A SACRIFICIAL LAYER

(75) Inventors: David Gutierrez, Plant City, FL (US); Vincent K. Luciani, Maple Grove, MN (US); Mary C. Burgess, Baltimore, MD (US)

(73) Assignee: Honeywell International Inc., Morristown, NJ (US)

( * ) Notice: Subject to any disclaimer, the term of this patent is extended or adjusted under 35 U.S.C. 154(b) by 277 days.

(21) Appl. No.: 09/902,116

(22) Filed: Jul. 10, 2001

(65) Prior Publication Data

US 2003/0010746 A1 Jan. 16, 2003

(51) Int. Cl.$^7$ ............................. B44C 1/22; C23F 1/00
(52) U.S. Cl. ............................. 216/2; 216/11; 216/27; 216/75; 430/313
(58) Field of Search ................... 216/2, 11, 27, 216/75; 430/313

(56) References Cited

U.S. PATENT DOCUMENTS

| | | | | |
|---|---|---|---|---|
| 5,324,683 A | * | 6/1994 | Fitch et al. ................. | 438/422 |
| 5,366,505 A | * | 11/1994 | Farber ...................... | 623/11.11 |
| 5,436,190 A | * | 7/1995 | Yang et al. ................. | 438/296 |
| 5,658,698 A | * | 8/1997 | Yagi et al. .................. | 430/11 |
| 6,258,732 B1 | * | 7/2001 | Lin et al. ................... | 438/780 |
| 6,486,751 B1 | * | 11/2002 | Barber et al. ............... | 333/187 |
| 6,596,624 B1 | * | 7/2003 | Romankiw ................. | 438/619 |

OTHER PUBLICATIONS http://www.dowcorning.com/page_generate.pl?id=9191, "Electronics: Semiconductor Fabrication Materials" downloaded Sep. 10, 2001, 1 page.
http://www.electrnicmaterials.com/businesses/wfm/dielectrics/flar0000.htm, "Wafer Fabrication Materials (WFM) Interconnect Dielectrics", downloaded Sep. 10, 2001, 4 pages.
http://www.semiconductor.net/semiconductor/issues/Issues/1998/sep98/docs/feature1.asp, "Pursuing the Perfect Low–k Dielectric", downloaded Sep. 10, 2001, 10 pages.

* cited by examiner

*Primary Examiner*—Shamim Ahmed
(74) *Attorney, Agent, or Firm*—Mathew Luxton

(57) ABSTRACT

A method for using an organic dielectric as a sacrificial layer for forming suspended or otherwise spaced structures. The use of an organic dielectric has a number of advantages, including allowing use of an organic solvent or etch to remove the sacrificial layer. Organic solvents only remove organic materials, and thus do not affect or otherwise damage non-organic layers such as metal layers. This may reduce or eliminate the need for the rinsing and drying steps often associated with the use of acidic etchants such as Hydrofluoric Acid.

26 Claims, 6 Drawing Sheets

USE OF AN ORGANIC DIELECTRIC AS A SACRIFICIAL LAYER

FIELD OF THE INVENTION

The present invention generally relates to semiconductor fabrication techniques, and more particularly, to semiconductor fabrication techniques that use a sacrificial layer.

BACKGROUND OF THE INVENTION

Traditionally, the miniaturization of mechanical and/or electromechanical systems has been frustrated by limitations on the manufacture of small lightweight mechanical or electromechanical parts. The intricacy of the parts made their manufacture on a small scale difficult and impractical. In recent years, however, and with the proliferation and increased precision in semiconductor fabrication procedures, many of the mechanical and electromechanical structures in a mechanical system may be replaced by MicroElectroMechanical Structures (MEMS) or other micromachined structures that are fabricated using semiconductor fabrication techniques.

During the fabrication of many of these structures, a sacrificial layer is provided to provide temporary support for subsequent layers. Once the subsequent layers are fabricated, the sacrificial layer is removed using a selective etch, which releases the upper layers. In many cases, the selective etch must remove the sacrificial layer from a remote location, requiring the etchant to reach deeply into very narrow crevices and channels.

In many cases, the sacrificial layer is formed from silicon dioxide or some other inorganic oxide or glass. An acid etch such as Hydrofluoric Acid is then used to remove the sacrificial layer. A limitation of using a silicon dioxide or other inorganic oxide or material is that the acidic etchants often require additional processing steps and can be difficult to perform. For example, to get a Hydrofluoric Acid etchant to flow deeply into small crevices and channels occupied by the sacrificial layer, surfactants must often be added. These surfactants can reduce the effectiveness of the Hydrofluoric Acid.

In addition, the removal of the Hydrofluoric Acid etchant from the small crevices and channels can be difficult. Several rinsing and drying steps are often performed in an attempt to remove the Hydrofluoric Acid from the structure. Even with these additional steps, some residual Hydrofluoric Acid often remains, which can reduce the reliability of the resulting structure.

Another limitation is that acidic etchants such as Hydrofluoric Acid tend to attack some metals such as aluminum. Accordingly, the sacrificial layer must often be either removed before any metal layers are provided, or additional processing steps must be performed to protect the metal layers from the Hydrofluoric Acid. However, even when the metal layers are provided after the sacrificial layer is removed, some residual Hydrofluoric Acid can remain, as described above. The residual Hydrofluoric Acid can emerge during later processing or testing, and damage the metal layers. This can compromise the reliability of the devices. What would be desirable, therefore, is a method for providing and removing a sacrificial layer without the use of an acidic etchant.

SUMMARY OF THE INVENTION

The present invention overcomes many of the disadvantages of the prior art by using an organic oxide as a sacrificial layer. The organic oxide can be selectively removed using an organic solvent or etchant such as acetone, oxygen plasma etch or other organic etchant that is less destructive to other layers of the device. Organic solvents or etchants tend to only remove organic materials. This may reduce or eliminate the need for the above-mentioned rinsing and drying steps associated with the use of acidic etchants such as Hydrofluoric Acid. Further, many organic solvents or etchants can more easily reach deeply into very narrow crevices and channels occupied by the sacrificial layer.

The use of an organic oxide as a sacrificial layer has many applications. For example, it is known that many MEMS and other micromachined devices have structures such as beams, slabs, combs, and fingers. To form these structures, a sacrificial layer is often used for temporary support. By reducing or eliminating the need for the rinsing and drying steps associated with acidic etchants, many of these structures can be more readily produced. In addition, many MEMS and other micromachined devices include conductive elements such as metal traces, pads, etc. By allowing the conductive elements to be provided before the sacrificial layer is removed, or by reducing or eliminating the processing steps required to protect the conductive elements from an acidic etchant, the fabrication of many of these structures can be simplified.

The use of an organic dielectric as a sacrificial layer can also be used to produce structures such as low capacitance metal interconnect lines, on-chip inductors, etc. For low capacitance interconnect lines, an organic dielectric may be used as a sacrificial layer between two metal interconnect lines. Later, the sacrificial layer may be removed using an organic solvent, which as described above, does not damage the metal interconnect lines. Since the capacitance between the two metal lines is dependent on the electric permittivity of the medium between the two conductors, and the electric permittivity of air is typically lower than that of a conventional interlayer dielectric material such as silicon oxide, the capacitance between the two conductors can be significantly reduced. This may significantly improve the performance (e.g., speed and power) of a corresponding circuit or device.

Likewise, an on-chip inductor can be formed by providing a spiral of metal lines, preferably using two or more metal layers and interconnecting VIA structures. A sacrificial layer can be provided between the two metal layers to support the upper metal layer during the fabrication process. Once the spiral is formed, the sacrificial layer can be removed. By using an organic dielectric, the sacrificial layer can be removed without causing damage to the metal lines that form the inductor.

In one illustrative method, a suspended structure is formed such as a MEMS or other micromachined structure, low capacitance metal interconnect line structure, on-chip inductor, etc. To form such a suspended structure, a first layer is provided. Then, a sacrificial second layer is provided above the first layer. In some embodiments, one or more intervening layers may be provided between the first layer and the sacrificial second layer, if desired. The one or more intervening layers may include, for example, an inorganic dielectric, a polysilicon layer, a metal layer, an etch stop layer, or some other material or material system.

The sacrificial second layer preferably includes an organic dielectric, and more preferably a low "k" organic dielectric. A third layer is then provided above the sacrificial second layer. Again, and in some embodiments, one or more intervening layers may be provided between the sacrificial second layer and the third layer, if desired. Finally, the sacrificial second layer is removed with an organic solvent or etch, leaving at least a portion of the third layer suspended. Preferably, the first layer, the third layer and selected intervening layers are substantially unaffected by the organic solvent.

It is contemplated that the first layer and/or one or more of the intervening layers (if provided) may be patterned before the sacrificial second layer is provided. Likewise, it is contemplated that the third layer and/or one or more of the intervening layers (if provided) may be patterned before removing the sacrificial second layer, as desired.

In another illustrative method, a structure having a first element spaced from a second element is provided. The spacing may be either a vertical spacing or horizontal spacing, or both. In this illustrative method, the first element and the second element are provided with a sacrificial layer therebetween. The sacrificial layer is an organic dielectric, which is subsequently removed using an organic solvent or etch. Preferably, the organic solvent does not substantially affect either the first or second elements, as in some embodiments, the first and/or second elements are exposed to the organic solvent.

In another illustrative embodiment, a VIA structure is provided for electrically connecting a lower metal layer to an upper metal layer and/or for mechanically supporting the upper metal layer above the lower metal layer. In this illustrative method, a lower metal layer is provided adjacent a substrate and is subsequently patterned. Like above, and in some embodiments, one or more intervening layers may be provided between the lower metal layer and the substrate. A sacrificial layer, including an organic dielectric is then provided over the lower metal layer. Thereafter, an inorganic dielectric such as TEOS (Tetra Ethra Orthor Di Silicate) Oxide is provided above the sacrificial layer. The TEOS Oxide layer is optional, and will eventually provide support to a suspended upper metal layer structure. The TEOS and sacrificial layers are then patterned to provide an opening to the lower metal layer.

The upper metal layer is then provided over the TEOS layer. The upper metal layer preferably extends down into the opening in the TEOS and sacrificial layers to form a connection with the lower metal layer. Alternatively, the opening may be filled with another material or layer before the upper metal layer is provided. The upper metal layer is then patterned, as desired. Finally, the sacrificial layer is removed using a suitable organic solvent, leaving the TEOS and upper metal layer suspended above the lower metal layer and/or substrate. The above described applications and structures are only illustrative. Those skilled in the art will recognize many other applications or structures that can benefit considerably from the use of an organic dielectric as a sacrificial layer.

DETAILED DESCRIPTION OF THE INVENTION

Figure 1A:
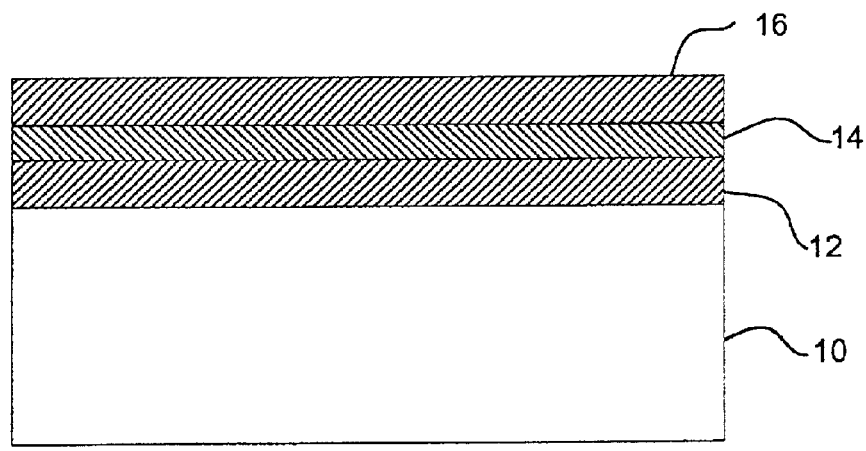
FIGS. 1A–1C are cross-sectional side views showing an illustrative method for forming a suspended structure.
Figure 1B:
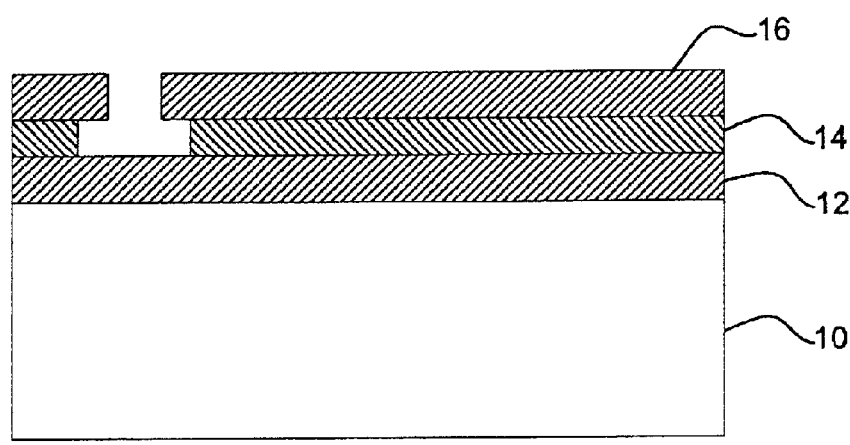
Figure 1C:
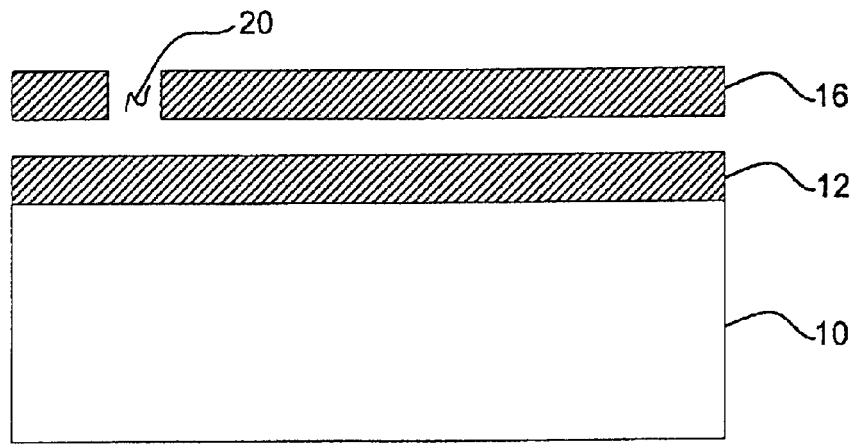

FIGS. 1A–1C are cross-sectional side views showing an illustrative method for forming a suspended structure. The illustrative suspended structure may be part of, for example, a beam, a slab, a comb, a finger, etc. of a MEMS or other micromachined device, a low capacitance metal interconnect line, an on-chip inductor, or any other suspended structure. FIG. 1A shows a substrate 10 having a first layer 12, a sacrificial second layer 14 provided above the first layer 12, and a third layer 16 provided above the sacrificial second layer 14.

Although not shown in FIG. 1A, one or more intervening layers may be provided between the substrate 10 and the first layer 12, the first layer 12 and the sacrificial second layer 14, and/or the sacrificial second layer 14 and the third layer 16, as desired. The one or more intervening layers may include, for example, an inorganic dielectric, a metal layer, a polysilicon layer, an optical layer, an etch stop layer, or any other material or material system that is desirable for a desired application. In some embodiments, the first layer 12 and/or selected intervening layers (if provided) may be patterned before the sacrificial second layer is provided.

The sacrificial second layer 14 preferably is an organic dielectric, and more preferably a low "k" organic dielectric. Example commercially available low "k" organic dielectrics include FLARE®, which is available from Honeywell International, FOX®, which is available from Dow Corning, and SILK®, which is available from Dow Chemical Corporation. FLARE®, FOX®, and SILK® are all thermal stable to relatively high temperatures. For example, FLARE® has a glass transition temperature that is above 400° C., SILK® is thermally stable to greater than 450° C., and FOX® is processed at above 400° C. The sacrificial second layer 14 is preferably spun on to a desired thickness.

As shown in FIG. 1B, the third layer 16, and any intervening layers (if provided) may be patterned using conventional photolithographic techniques. In one embodiment, the third layer 16 is patterned to define the desired suspended structure, such as a beam, a slab, a comb, a finger, etc. The etchant used to pattern the third layer 16 may etch some of the sacrificial second layer 14 through opening 20, as shown. However, this is not required or even desired in some applications. The illustrative opening 20 provides access to the sacrificial second layer 14.

Referring to FIG. 1C, the sacrificial second layer 14 is then removed with an organic solvent, preferably through opening 20, leaving at least a portion of the third layer 16 suspended over the first layer 12. The organic solvent may be, for example, an acetone, an oxygen plasma etch or any other organic solvent.

As indicated above, using an organic dielectric as a sacrificial second layer has a number of advantages. One advantage is that organic solvents or etchants can be used to remove the sacrificial layer. As indicated above, many organic solvents can more easily reach deeply into very narrow crevices and channels occupied by the sacrificial layer. Another advantage of using an organic solvent is that it typically only removes organic materials. Thus, when the first layer 12 and the third layer 16 are metal layers, the organic solvent may not affect or otherwise damage these layers. In some cases, the organic solvent may actually clean these materials, which may potentially improve the performance or reliability of the resulting device. As a result, the first layer 12, the third layer 16 and any other layers that are exposed to the organic solvent need not be provided before the sacrificial layer 14 is removed, or separately protected from the organic solvent or etchant when provided after the sacrificial layer 14 is removed. This may simplify the fabrication of such structures.

Figure 2A:
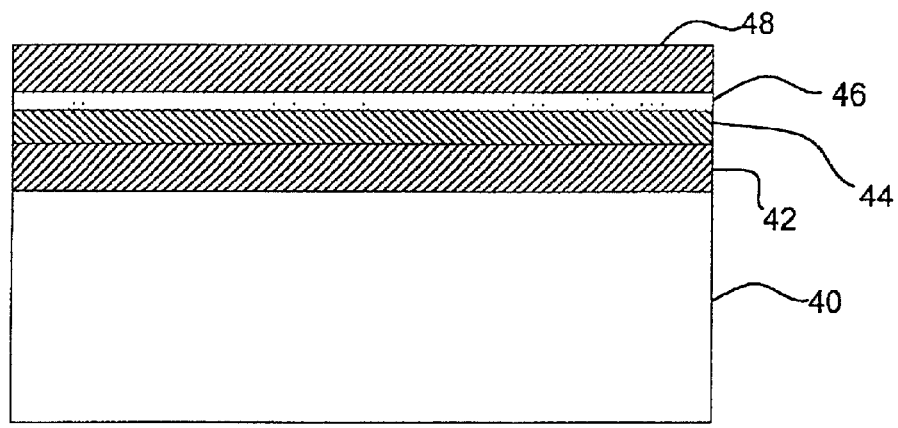
FIGS. 2A–2C are cross-sectional side views showing another illustrative method for forming a suspended structure.
Figure 2B:
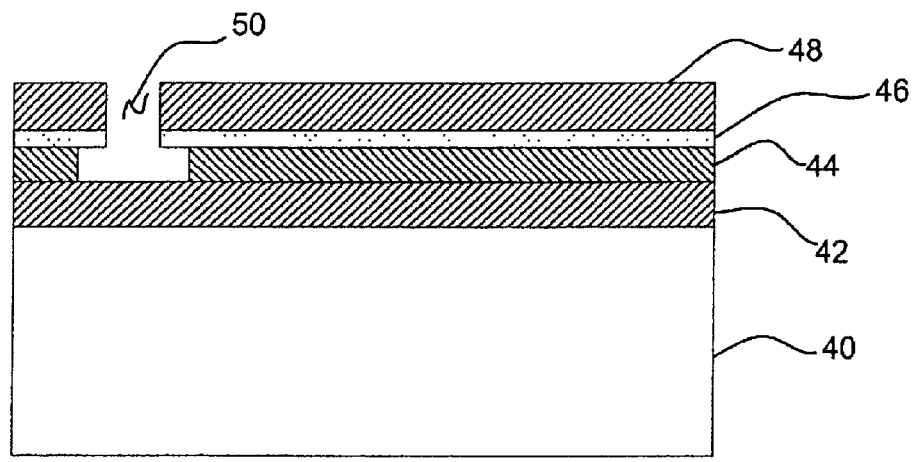
Figure 2C:
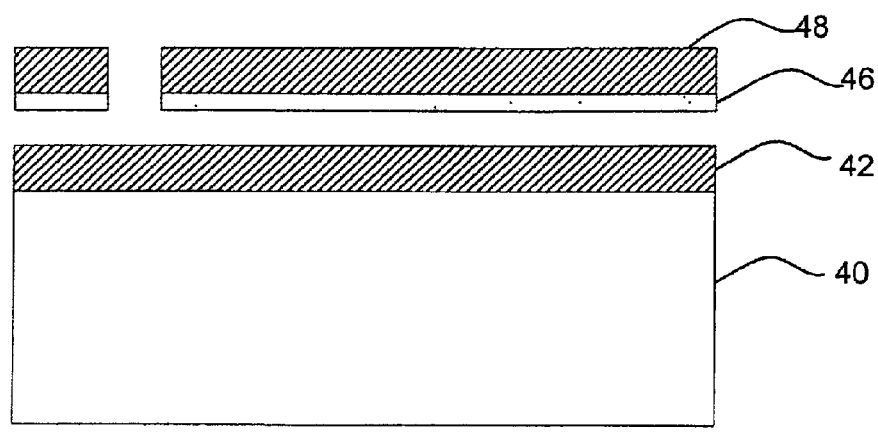

FIGS. 2A–2C are cross-sectional side views showing another illustrative method for forming a suspended structure. This method is similar to that described above with respect to FIGS. 1A–1C, but an intervening layer 46 is provided between the sacrificial second layer 44 and the third layer 49. The intervening layer 46 may be, for example, an inorganic dielectric, a metal layer, a polysilicon layer, an optical layer, an etch stop layer, or any other material or material system that is desirable for a particular application.

FIG. 2A shows a substrate 40 having a first layer 42, a sacrificial second layer 44 provided above the first layer 42, an intervening layer 46 provided above the sacrificial second layer 44, and a third layer 48 provided above the intervening layer 46. Although not shown in FIG. 2A, one or more other intervening layers may be provided between the various layers, if desired. In the illustrative embodiment, the intervening layer 46 is an inorganic dielectric that will eventually provide support for the third layer 48.

As shown in FIG. 2B, the third layer 48 and intervening layer 46 are patterned using conventional photolithographic techniques. In one embodiment, the third layer 48 is patterned to define the desired suspended structure, such as a beam, a slab, a comb, a finger, etc. The etchant used to pattern the third layer 48 may etch the intervening layer 46 and the sacrificial second layer 44, as shown, to provide an opening 50. The opening 50 may provide access to the sacrificial second layer 44.

Referring to FIG. 2C, the sacrificial second layer 44 is then removed with an organic solvent, preferably through opening 50, leaving at least a portion of the third layer 48 and the intervening layer 46 suspended over the first layer 42. As indicated above, the intervening layer 46 may help provide support to the third layer 48 once the third layer 48 is released.

FIGS. 3A–3D are cross-sectional side views showing yet another illustrative method for forming a suspended structure. In this embodiment, a VIA or support structure for electrically connecting a lower metal layer to an upper metal layer and/or for mechanically supporting an upper layer above a lower layer is provided. A lower layer 60 is provided adjacent a substrate 62, and is subsequently patterned leaving lower layer elements 60a and 60b. Like above, and in some embodiments, one or more intervening layers may be provided between the lower layer 60 and the substrate 62, if desired.

Figure 3A:
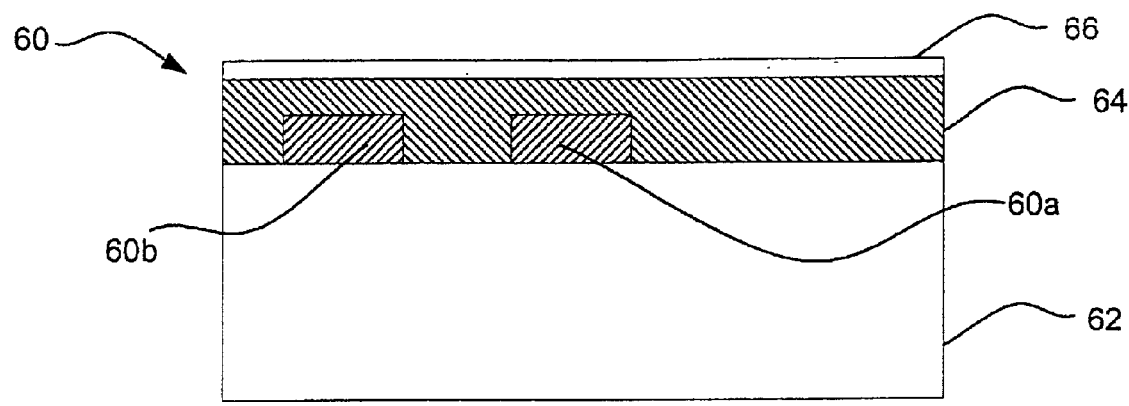
FIGS. 3A–3D are cross-sectional side views showing yet another illustrative method for forming a suspended structure.
Figure 3B:
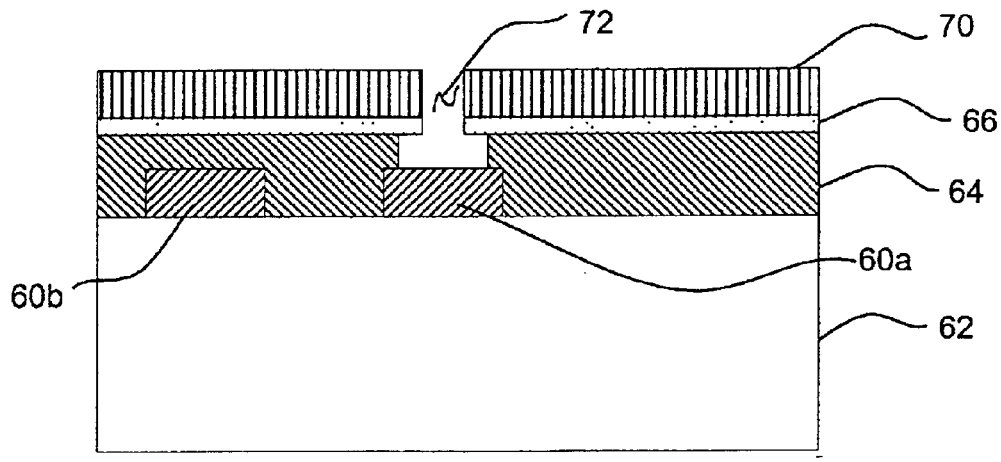

A sacrificial layer 64, including an organic dielectric, is provided over the lower layer 62 as shown. Thereafter, and in the illustrative embodiment, an inorganic dielectric layer 66 such as TEOS (Tetra Ethra Orthor Di Silicate) Oxide is provided above the sacrificial layer 64. The TEOS Oxide layer 66 will eventually provide support for a suspended upper layer structure, as more fully described below. As shown in FIG. 3B, the TEOS layer 66 and the sacrificial layer 64 may be patterned using a patterned mask 70, preferably resulting in an opening 72 to the lower layer element 60a.

Figure 3C:
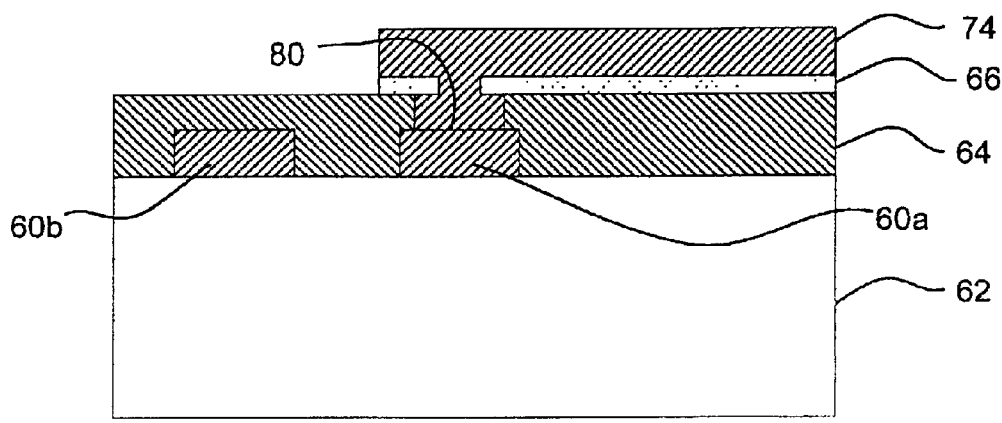
Figure 3D:
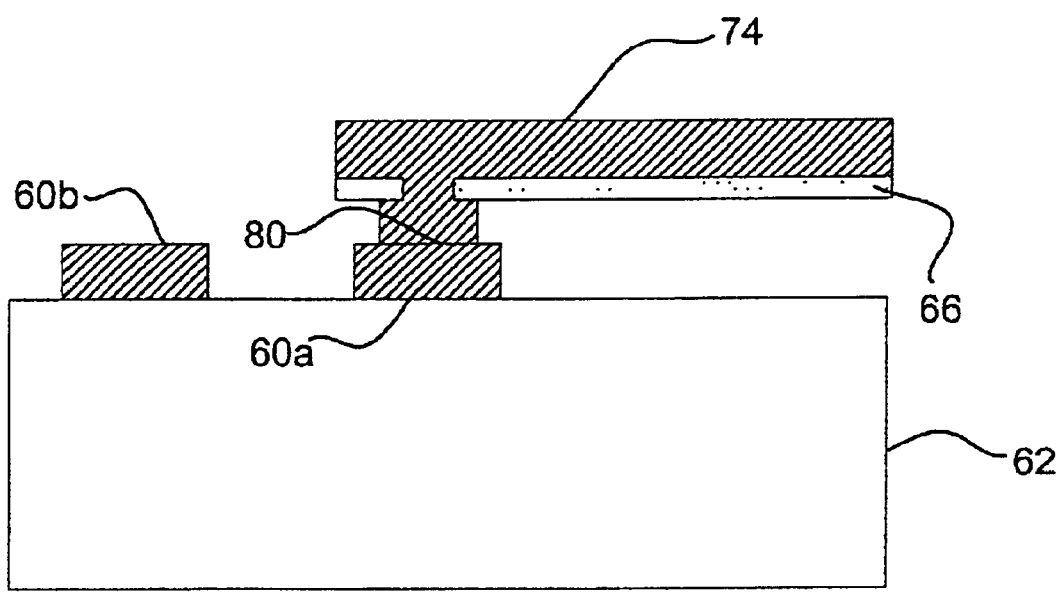

Referring now to FIG. 3C, once the patterned mask 70 is removed, an upper layer 74 is provided above the TEOS layer, as shown. The upper layer preferably extends down into the opening 72 to form a connection with the lower layer element 60a, as shown. Alternatively, however, the opening 72 may be filled with another material or layer (not shown) before the upper layer 74 is provided. The upper layer 74 is then patterned, as desired. Finally, and as shown in FIG. 3D, the sacrificial layer is removed using a suitable organic solvent or etchant, leaving the patterned TEOS layer 66 and upper layer 74 suspended above the lower layer 60 and/or substrate 62.

In one embodiment, the first layer 60 and the third layer 74 are conductive elements having, for example, an aluminum or copper concentration. When so provided, the first layer 60 and the third layer 74 may be electrically connected at interface 80. Alternatively, opening 72 may be filled with a plug, such as a tungsten plug, before the third layer 74 is provided to provide the electrical interconnection. Either way, such a structure can provide a VIA structure that provides the electrical connection and mechanical support for the third layer 74.

In this embodiment, the first layer 60 and the third layer 74 are exposed to the solvent or etchant used to remove the sacrificial second layer 64. By using an organic dielectric for the sacrificial second layer 64, an organic solvent or etchant can be used to remove the sacrificial second layer 64. Organic solvents tend to only remove organic materials, and thus will not affect or otherwise damage the conductive first layer 60 and third layer 74. In some cases, the organic solvent may actually clean these layers, which may improve the performance or reliability of the resulting device.

As can be seen in FIGS. 3A–3D, the first layer 60 may include first layer element 60b. When the sacrificial second layer 64 is removed, the first layer elements 60a and 60b are separated by an air gap. This illustrates that the present invention may be used to form a spacing between elements that is either vertical or horizontal, or both.

Figure 4:
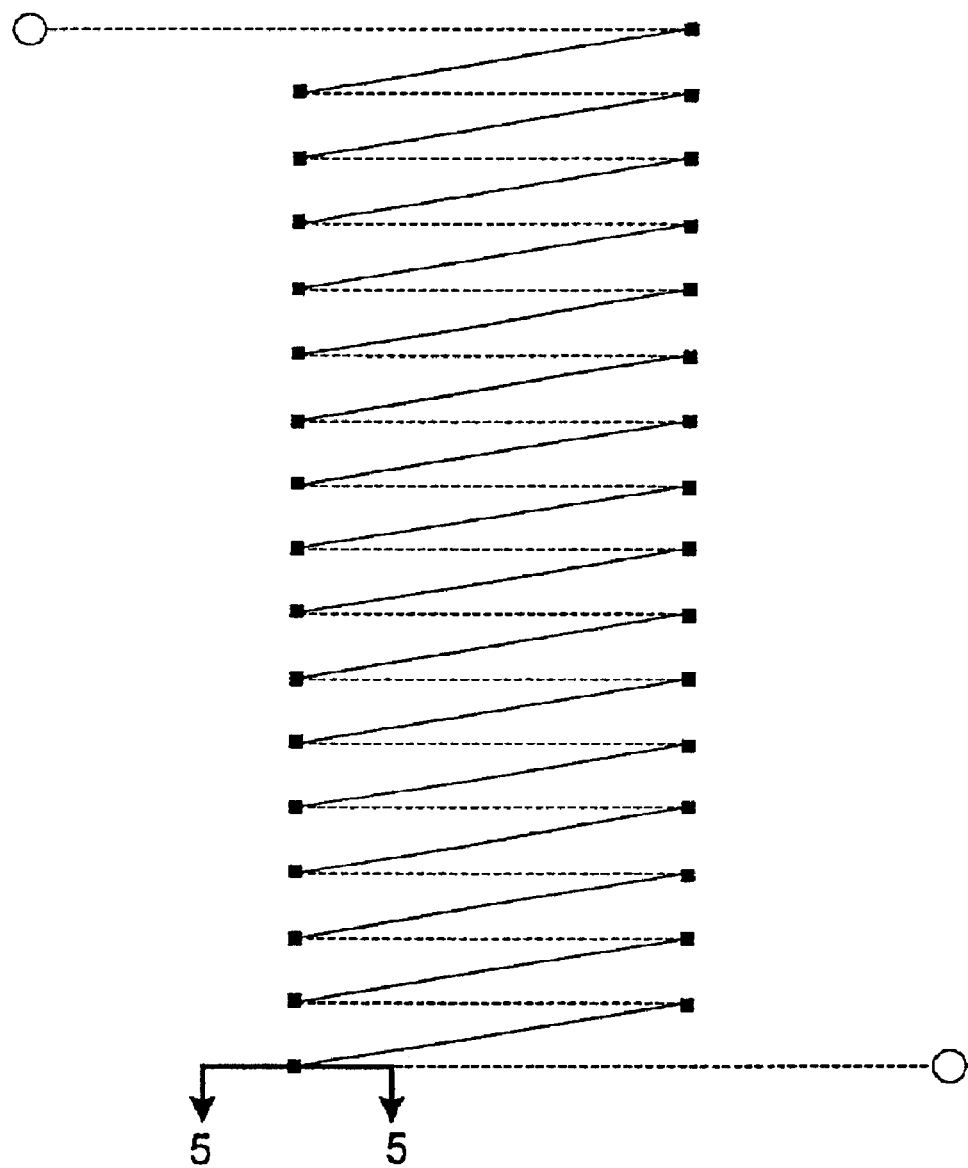
FIG. 4 is a schematic diagram showing an illustrative inductor formed on a substrate.

FIG. 4 is a schematic diagram showing an illustrative inductor formed on a substrate. The inductor is generally shown at 90, and has a number of metal lines interconnected into a spiral shape, preferably using two or more metal layers and interconnecting VIA structures. In FIG. 4, the metal lines that are formed on a first metal layer are shown in solid lines, and the metal lines that are formed on a second metal layer are shown in dashed lines. The VIA structures are shown as black boxes, and are used to provide an electrical interconnection between the metal lines on the first metal layer with appropriate metal lines on the second metal layer. As indicated above, the metal lines on the first metal layer, the metal lines on the second metal layer, and the VIA structures are preferably combined to form a spiral structure, as shown.

Figure 5:
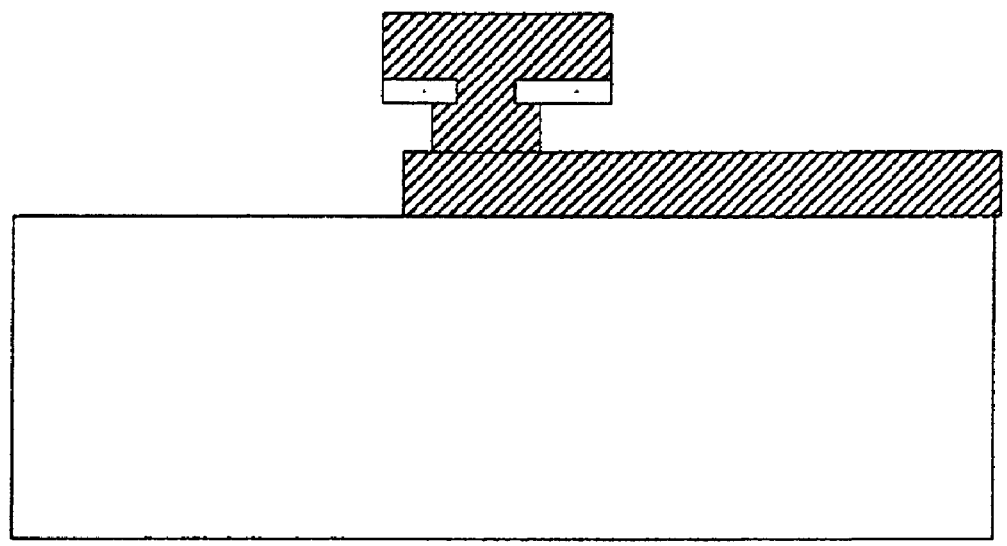
FIG. 5 is a cross-sectional side view of the inductor of FIG. 4 taken along line 5—5.

To fabricate the on-chip inductor, the metal lines formed on the first metal layer are preferably provided and patterned, followed by a sacrificial layer formed of an organic dielectric. Then, the VIA structures and the metal lines on the second metal layer are provided and patterned, preferably in a manner similar to that described above with respect to FIGS. 3A–3D. Once the metal lines on the first metal layer and the metal lines on the second metal layer are connected in a spiral pattern, the sacrificial layer is removed. By using an organic dielectric, the sacrificial layer can be removed with an organic solvent or etchant. As indicated above, an organic solvent or etchant typically only removes organic material, and thus may not damage the metal lines that form the inductor. Once the sacrificial layer is removed, each of the metal lines is preferably separated from adjacent metal lines by an air gap. This is shown in FIG. 5, which shows a cross-sectional side view of the inductor of FIG. 4 taken along line 5—5. By providing an air gap between adjacent metal lines, the parasitic capacitance between metal lines can be reduced, thereby providing a more ideal inductor.

By using an organic dielectric, and thus an organic solvent, the metal lines on the first metal layer and the metal lines on the second metal layer can be exposed to the organic solvent. Thus, these metal lines need not all be fabricated before the sacrificial layer 14 is removed, or separately protected from the etchant when provided after the sacrificial layer 14 is removed. This may simplify the fabrication of such structures.

The above described applications and structures are only illustrative. Those skilled in the art will recognize many other applications or structures that can benefit considerably from the use of an organic dielectric as a sacrificial layer.

What is claimed is:

1. A method for forming a MEMS device having a suspended structure, wherein at least part of the suspended structure moves during normal operation of the MEMS device, comprising:

providing a first layer;

providing a sacrificial second layer above the first layer, the sacrificial second layer including an organic dielectric that is thermally stable to a thermally stable temperature that is at or above about 400° C.;

providing one or more upper layers above the sacrificial second layer; and removing the sacrificial second layer with an organic solvent, leaving at least a portion of at least one of the one or more upper layers suspended, the one or more upper layers forming at least part of the suspended structure of the MEMS device.

2. A method according to claim 1, wherein the first layer and the at least one of the one or more suspended upper layers are substantially unaffected by the organic solvent.

3. A method according to claim 1, further comprising providing one or more other layers between the first layer and the sacrificial second layer.

4. A method according to claim 3, wherein one of the one or more other layers includes an inorganic dielectric.

5. A method according to claim 1, wherein one of the one or more upper layers includes an inorganic dielectric.

6. A method according to claim 1, further comprising patterning the first layer before providing the sacrificial second layer.

7. A method according to claim 1, further comprising patterning at least one of the one or more upper layers before removing the sacrificial second layer.

8. A method according to claim 1, further comprising patterning the sacrificial second layer before providing the one or more upper layers.

9. A method according to claim 1, wherein the first layer is a metal layer.

10. A method according to claim 9, wherein at least one of the one or more upper layers is a TEOS dielectric layer.

11. A method according to claim 9, wherein at least one of the one or more upper layers is a metal layer.

12. A method according to claim 11, wherein the sacrificial second layer and at least one of the one or more upper layers are patterned to form a via between the first layer and at least one of the one or more of the upper layers.

13. A method according to claim 1, wherein the second sacrificial second layer is removed using an isotropic etch.

14. A method according to claim 1, wherein the first layer is a metal layer.

15. A method according to claim 1, wherein at least one of the one or more upper layers is a metal layer.

16. A method according to claim 1, wherein the sacrificial second layer is spun onto the first layer.

17. A method according to claim 1, wherein the sacrificial second layer includes an organic low k dielectric.

18. A method for forming a MEMS device having a first element spaced from a second element, wherein the first element is suspended above the second element, and wherein at least part of the first element moves during normal operation of the MEMS device, comprising:

providing the first element and the second element, with a sacrificial layer therebetween, the sacrificial layer being an organic dielectric that is thermally stable to a thermally stable temperature that is at or above about 400° C.;

performing additional processing steps after the sacrificial layer is provided; and removing the sacrificial layer using an isotropic etch.

19. A method according to claim 18, wherein the sacrificial layer is removed using an organic solvent.

20. A method according to claim 19, wherein the first element and the second element are substantially unaffected by the organic solvent.

21. A method for forming a MEMS device having a first element spaced from a second element, wherein the first element is suspended above the second element, and wherein at least part of the first element moves during normal operation of the MEMS device, comprising:

providing a first layer and a second layer, with a sacrificial layer therebetween, the sacrificial layer including an organic dielectric that is thermally stable to a thermally stable temperature that is at or above about 400° C.;

performing additional processing steps after the sacrificial layer is provided; and removing the sacrificial layer using an organic solvent.

22. A method according to claim 21, further comprising providing a metal layer before the sacrificial layer is removed.

23. A method according to claim 22, wherein the metal layer is exposed to the organic solvent.

24. A method for manufacturing a suspended beam, slab, comb, and/or finger of a MEMS device, comprising:

providing a sacrificial layer, the sacrificial layer including an organic dielectric that is thermally stable to a thermally stable temperature that is at or above about 400° C.;

performing additional processing steps after the sacrificial layer is provided including providing a metal layer; and removing the sacrificial layer using an organic solvent, the metal layer being exposed to the organic solvent, resulting in the suspended beam, slab, comb, and/or finger of the MEMS device.

25. A method for forming a suspended structure of a MEMS device, wherein at least part of the suspended structure moves during normal operation of the MEMS device, comprising:

providing a first layer;

providing a sacrificial second layer above the first layer, the sacrificial second layer including an organic dielectric that is thermally stable to a thermally stable temperature that is at or above about 400° C.;

providing one or more upper layers above the sacrificial second layer; and removing the sacrificial second layer with an organic solvent, leaving at least a portion of at least one of the one or more upper layers suspended, the one or more upper layers forming at least part of the movable suspended structure of the MEMS device.

26. A method for forming an inductor on a substrate, comprising:

providing a first conductive layer;

providing a sacrificial second layer above the first conductive layer, the sacrificial second layer including an organic dielectric that is thermally stable to a thermally stable temperature that is at or above about 400° C.;

providing one or more upper layers above the sacrificial second layer, wherein at least one of the upper layers is conductive; and removing the sacrificial second layer with an organic solvent, leaving at least a portion of at least one of the one or more upper layers suspended including the at least one upper layer that is conductive, the first conductive layer and the at least one upper layer that is conductive forming at least part of the inductor.

* * * * *